United States Patent
Nakazumi et al.

(10) Patent No.: US 9,337,320 B2
(45) Date of Patent: May 10, 2016

(54) METHOD OF MANUFACTURING ZINC OXIDE THIN FILM, METHOD OF MANUFACTURING THIN FILM TRANSISTOR, ZINC OXIDE THIN FILM, THIN FILM TRANSISTOR, AND TRANSPARENT OXIDE WIRING

(71) Applicant: NIKON CORPORATION, Tokyo (JP)

(72) Inventors: Makoto Nakazumi, Yamato (JP); Yasutaka Nishi, Tokyo (JP)

(73) Assignee: NIKON CORPORATION, Tokyo (JP)

(*) Notice: Subject to any disclaimer, the term of this patent is extended or adjusted under 35 U.S.C. 154(b) by 0 days.

(21) Appl. No.: 14/570,191

(22) Filed: Dec. 15, 2014

(65) Prior Publication Data
US 2015/0187916 A1 Jul. 2, 2015

Related U.S. Application Data

(63) Continuation of application No. PCT/JP2013/068136, filed on Jul. 2, 2013.

(30) Foreign Application Priority Data

Jul. 5, 2012 (JP) .................................. 2012-151206

(51) Int. Cl.
*H01L 21/02* (2006.01)
*H01L 29/786* (2006.01)
(Continued)

(52) U.S. Cl.
CPC ............ *H01L 29/66969* (2013.01); *C25D 5/02* (2013.01); *C25D 9/08* (2013.01); *H01L 21/02425* (2013.01); *H01L 21/02491* (2013.01); *H01L 21/02494* (2013.01); *H01L 21/02554* (2013.01); *H01L 21/02565* (2013.01); *H01L 21/02617* (2013.01); *H01L 21/02628* (2013.01); *H01L 21/768* (2013.01); *H01L 27/124* (2013.01); *H01L 27/1292* (2013.01); *H01L 29/24* (2013.01); *H01L 29/45* (2013.01); *H01L 29/7869* (2013.01); *Y10T 428/24802* (2015.01)

(58) Field of Classification Search
CPC .............. H01L 29/66969; H01L 29/24; H01L 29/7869; H01L 21/02565; H01L 21/768; H01L 21/02617
USPC ........................... 257/43; 438/61–62, 85, 104
See application file for complete search history.

(56) References Cited

U.S. PATENT DOCUMENTS

| 5,219,828 A | * | 6/1993 | Shintaku et al. | ............... 505/472 |
| 6,346,184 B1 | * | 2/2002 | Sano et al. | .................... 205/199 |
| 2006/0096867 A1 | * | 5/2006 | Bokisa et al. | .................. 205/253 |

FOREIGN PATENT DOCUMENTS

JP 10-313127 11/1998

OTHER PUBLICATIONS

International Search Report mailed Oct. 8, 2013, in corresponding International Patent Application No. PCT/JP2013/068136.
(Continued)

*Primary Examiner* — Christine Enad

(57) ABSTRACT

A method of manufacturing a zinc oxide thin film includes: immersing a base having a conductive portion in at least part of the base, in a solution containing zinc ions, hydroxide ions, and zinc complex ions; and by applying an alternating current to the conductive portion, forming a zinc oxide thin film on a region of the base, the region including the conductive portion.

12 Claims, 8 Drawing Sheets

(51) Int. Cl.
*H01L 29/66* (2006.01)
*C25D 9/08* (2006.01)
*H01L 29/45* (2006.01)
*H01L 27/12* (2006.01)
*C25D 5/02* (2006.01)
*H01L 21/768* (2006.01)
*H01L 29/24* (2006.01)

(56) References Cited

OTHER PUBLICATIONS

Written Opinion mailed Oct. 8, 2013 issued with respect to PCT/JP2013/068136.

* cited by examiner

| pH | 8.8 | 9 | 9.3 | 9.5 | 11 (EXAMPLE 1) |
|---|---|---|---|---|---|
| STATE OF ZINC OXIDE | FINE PARTICLES | FINE PARTICLES | THIN FILM | THIN FILM | THIN FILM |
| FILM THICKNESS [nm] | N/A | N/A | 10 | 20 | 50 |
| MOBILITY [cm$^2$/V·s] | N/A | N/A | $3.4 \times 10^{-5}$ | 0.14 | 0.13 |
| ON/OFF RATIO | N/A | N/A | $10^3$ | $10^4$ | $10^4$ | though the quality...

METHOD OF MANUFACTURING ZINC OXIDE THIN FILM, METHOD OF MANUFACTURING THIN FILM TRANSISTOR, ZINC OXIDE THIN FILM, THIN FILM TRANSISTOR, AND TRANSPARENT OXIDE WIRING

CROSS-REFERENCE TO RELATED APPLICATION

This is a Continuation Application of International Application No. PCT/JP2013/68136 filed on Jul. 2, 2013, which claims priority on Japanese Patent Application No. 2012-151206 filed on Jul. 5, 2012, the contents of which are incorporated herein by reference.

BACKGROUND

1. Field of the Invention

The present invention relates to a method of manufacturing a zinc oxide thin film, a method of manufacturing a thin film transistor, a zinc oxide thin film, a thin film transistor, and a transparent oxide wiring.

2. Background

A zinc oxide thin film is a material having both visible light transparency and electrical conductivity, and therefore has been used as a transparent electrode of a flat panel display (FPD), a thin film solar cell, or the like.

The zinc oxide thin film is generally deposited by a vacuum deposition method such as a sputtering method. Since the vacuum deposition method requires a large-scale vacuum apparatus, the manufacturing cost increases.

As a further simple deposition method of the zinc oxide thin film, wet deposition methods such as a sol-gel method, an electroless deposition method, and an electrolytic deposition method are known. As a deposition method using the electrolytic deposition method of the above methods, a method is known in which a conductive substrate is immersed in an aqueous solution containing zinc ions, and by applying a voltage to the conductive substrate, a zinc oxide thin film is deposited on a cathode (for example, refer to Japanese Patent Application, Publication No. H10-313127A).

SUMMARY

However, in the sol-gel method, there is a problem that the deposition temperature is high, and it is difficult to deposit a zinc oxide thin film at a low temperature. Further, in the electroless deposition method, there is a problem that it is difficult to deposit a zinc oxide thin film having a uniform thickness and film quality. On the other hand, in the electrolytic deposition method, it is possible to grow a thin film having a high crystalline quality selectively on an electrode with good reproducibility; however, there is a problem that a thin film is not deposited on a non-conductive insulation layer.

Therefore, it is difficult to deposit a zinc oxide thin film on an insulation layer between electrodes such as between a source and a drain of a thin film transistor such that the zinc oxide thin film bridges the gap between the electrodes, and it is difficult to use an obtained zinc oxide thin film as a channel layer or a wiring of a thin film transistor.

An object of an aspect of the present invention is to provide a method of manufacturing a zinc oxide thin film, a method of manufacturing a thin film transistor, a zinc oxide thin film, a thin film transistor, and a transparent oxide wiring, the zinc oxide thin film manufacturing method being capable of manufacturing a zinc oxide thin film available for a channel layer or a wiring of a thin film transistor while being an electrolytic deposition method as a non-vacuum and low-temperature wet deposition method.

According to a first aspect of the present invention, a method of manufacturing a zinc oxide thin film includes: immersing a base having a conductive portion in at least part of the base, in a solution containing zinc ions, hydroxide ions, and zinc complex ions; and by applying an alternating current to the conductive portion, forming a zinc oxide thin film on a region of the base, the region including the conductive portion.

According to a second aspect of the present invention, in the method of manufacturing a zinc oxide thin film according to the first aspect, the base has at least a pair of conductive portions arranged to face to each other across an insulation gap, and by applying the alternating current to one of the conductive portions of the pair, a zinc oxide thin film is formed such that the zinc oxide thin film bridges a gap between the conductive portions of the pair.

According to a third aspect of the present invention, in the method of manufacturing a zinc oxide thin film according to the first or second aspect, the pH of the solution is 8 to 12.

According to a fourth aspect of the present invention, in the method of manufacturing a zinc oxide thin film according to any one of the first to third aspects, the temperature of the solution is 150° C. or less.

According to a fifth aspect of the present invention, in the method of manufacturing a zinc oxide thin film according to any one of the first to fourth aspects, the frequency of the alternating current is 0.1 to 10 Hz.

According to a sixth aspect of the present invention, a method of manufacturing a thin film transistor includes: by the method of manufacturing a zinc oxide thin film according to any one of the first to fifth aspects of the present invention, forming a zinc oxide thin film such that the zinc oxide thin film bridges a gap between a source electrode and a drain electrode formed on a substrate.

According to a seventh aspect of the present invention, there is provided the zinc oxide thin film manufactured by the method of manufacturing a zinc oxide thin film according to any one of the first to fifth aspects of the present invention.

According to an eighth aspect of the present invention, a thin film transistor includes: a channel layer formed by the zinc oxide thin film manufactured by the method of manufacturing a thin film transistor according to the sixth aspect of the present invention.

According to a ninth aspect of the present invention, a thin film transistor includes: a gate insulation layer formed by the zinc oxide thin film manufactured by the method of manufacturing a thin film transistor according to the sixth aspect of the present invention.

According to a tenth aspect of the present invention, there is provided a transparent oxide wiring made of the zinc oxide thin film manufactured by the method of manufacturing a zinc oxide thin film according to any one of the first to fifth aspects of the present invention.

According to the method of manufacturing a zinc oxide thin film of an aspect of the present invention, it is possible to manufacture a zinc oxide thin film available for a channel layer or a wiring of a thin film transistor while the method being an electrolytic deposition method as a non-vacuum and low-temperature wet deposition method.

DESCRIPTION OF THE EMBODIMENTS

Hereinafter, with reference to the drawings, a method of manufacturing a zinc oxide thin film, a zinc oxide thin film, a thin film transistor, and a transparent oxide wiring according to the present embodiment will be described.

Note that, in the following drawings, the dimensions, ratios, and the like of each constituent element are varied for ease of understanding.

In addition, the present embodiment is intended to explain the scope of the invention in detail so that it can be better understood, and does not limit the present invention unless otherwise specified.

[Method of Manufacturing a Zinc Oxide Thin Film]

A method of manufacturing a zinc oxide thin film of the present embodiment includes: immersing a base having a conductive portion in at least part of the base, in a solution containing zinc ions, hydroxide ions, and zinc complex ions; and by applying an alternating current to the conductive portion, forming a zinc oxide thin film on a region of the base, the region including the conductive portion.

Figure 1:
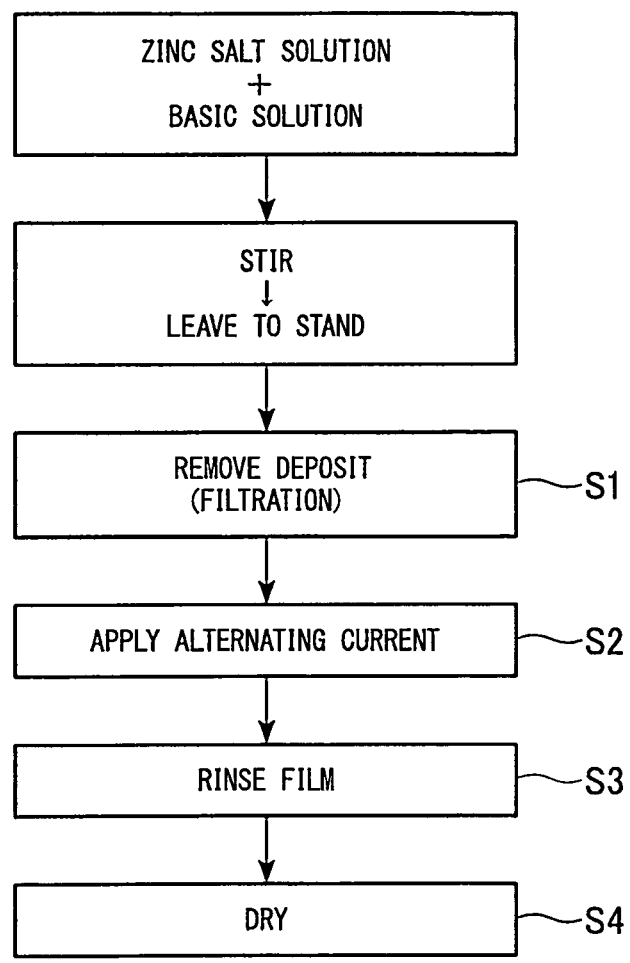
FIG. 1 is a flowchart showing a method of manufacturing a zinc oxide thin film.
Figure 2A:
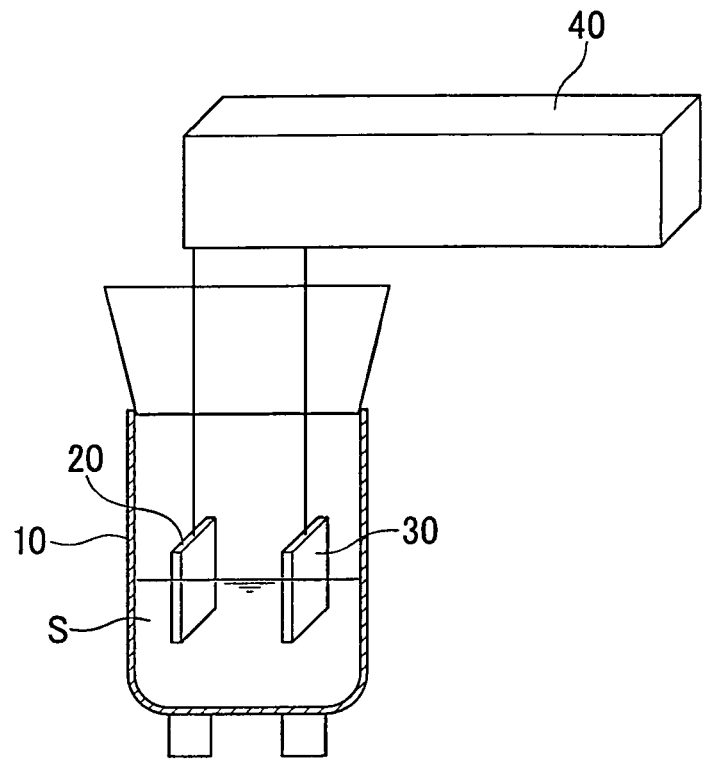
FIG. 2A is a process diagram showing an example of the method of manufacturing a zinc oxide thin film.
Figure 2B:
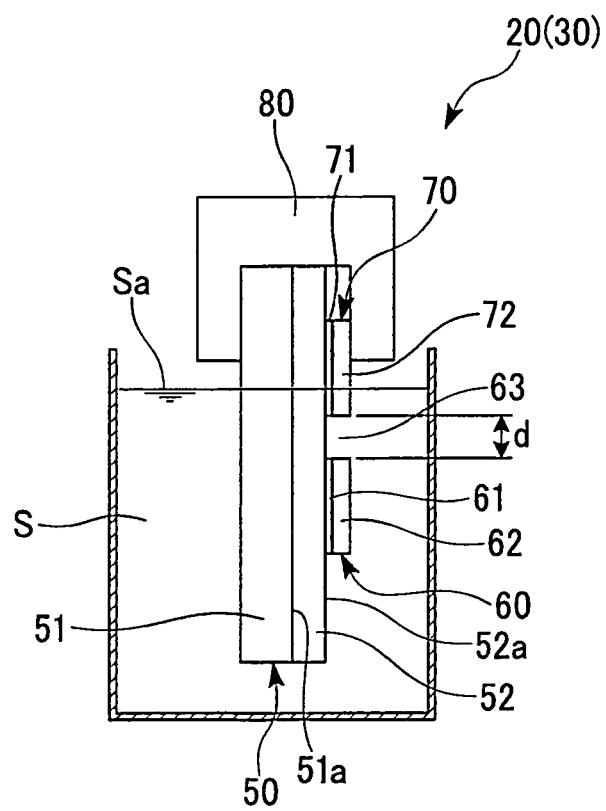
FIG. 2B is a process diagram showing an example of the method of manufacturing a zinc oxide thin film.
Figure 2C:
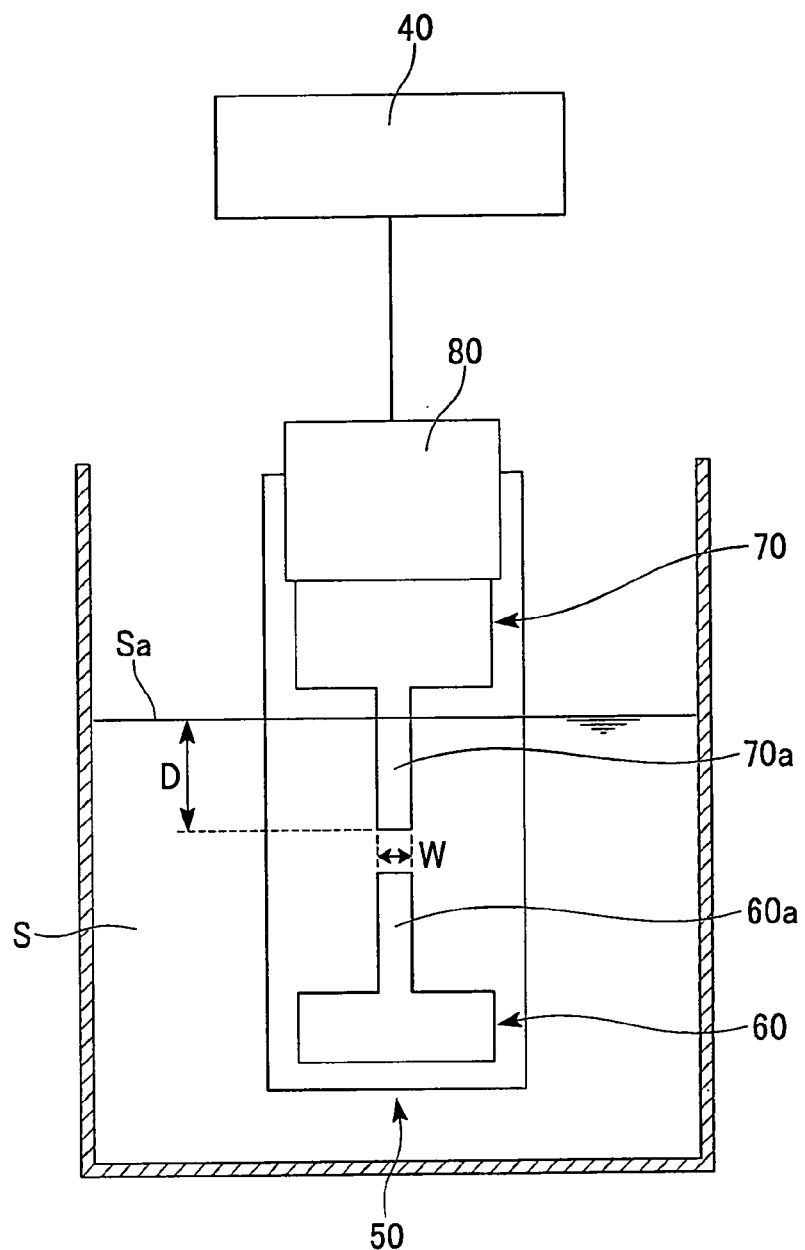
FIG. 2C is a process diagram showing an example of the method of manufacturing a zinc oxide thin film.

FIG. 1 and FIGS. 2A to 2C are diagrams showing a method of manufacturing a zinc oxide thin film according to the present embodiment. FIG. 1 is a flowchart showing the method of manufacturing a zinc oxide thin film. Each of FIGS. 2A to 2C is a process diagram showing an example of the method of manufacturing a zinc oxide thin film.

First, as shown in FIG. 1, a solution is prepared in which a zinc salt is dissolved (zinc salt solution) and mixed with a basic solution, and then stirred at room temperature and left to stand.

The solvent of the zinc salt solution and the solvent of the basic solution are not particularly limited as long as each solute can be dissolved. Water can be used as the solvent of the zinc salt solution and the solvent of the basic solution. For example, a zinc salt solution prepared using water as a solvent can be mixed with a basic aqueous solution. In the present embodiment, water is used as the solvent.

Note that, a solvent other than water is not particularly limited as long as the solute can be dissolved, and for example, an alcohol can be used.

As the zinc salt as a solute of the zinc salt solution, one which is dissolved in a solvent (water) and generates zinc ions ($Zn^{2+}$) is used. For example, zinc nitrate, zinc chloride, zinc acetate, zinc citrate, zinc sulfate or the like is used.

As a solute of the basic solution, one which is dissolved in a solvent (water) and generates hydroxide ions ($OH^-$) is used. For example, sodium hydroxide, potassium hydroxide, calcium hydroxide, ammonia, or the like is used.

According to the above, zinc ions ($Zn^{2+}$) dissolved in the solution bind to hydroxide ions ($OH^-$) and become zinc hydroxide ($Zn(OH)_2$), and a colloidal white precipitate is generated.

Moreover, by setting the pH of the solution to 8 or more, zinc hydroxide as a white precipitate binds to hydroxide ions, generates tetrahydroxozincate (II) ions ($[Zn(OH)_4]^{2-}$), and is dissolved into the solution.

Next, the white precipitate of zinc hydroxide remaining in the solution is separated using a centrifuge, and the supernatant is collected (step S1).

The solution thus obtained is a "basic solution containing tetrahydroxozincate (II) ions". Note that, the "basic solution containing tetrahydroxozincate (II) ions" contains zinc ions and hydroxide ions, in addition to tetrahydroxozincate (II) ions.

In the following description, the term "basic solution containing tetrahydroxozincate (II) ions" may be referred to as a "solution S".

The pH of the solution S can be 8 to 12 and is preferably 9 to 10.

When the pH of the solution S is less than 8, the concentration of hydroxide ions is too low to stably form tetrahydroxozincate (II) ions in the solution S, and it may be impossible to form a thin film made of zinc oxide by applying an alternating current to the solution S as described below. On the other hand, when the pH of the solution S is more than 12, the concentration of hydroxide ions is too high, and a generated zinc oxide thin film may be eluted.

In order to adjust the pH of the solution S to be in the above range, the addition amount of the basic solution to the zinc salt solution is adjusted. Alternatively, the pH may be adjusted by adding an acidic solution such as a zinc salt solution, nitric acid, or hydrochloric acid.

Next, as shown in FIG. 2A, a pair of bases 20, 30 is immersed in the solution S in a container 10 at a predetermined distance between the bases, and by applying an alternating current from an AC power source 40 between conductive portions, one of the conductive portions being formed on the surface of each of the bases 20, 30, a zinc oxide thin film is formed on a region including each of the conductive portions of the base surface (step S2).

Note that, each of the bases 20, 30 is a member provided with a portion having electrical conductivity on at least part of the surface, and the whole of the base may be configured by an electrical conductor such as a metal. Further, the base may be one in which a conductive film of a predetermined pattern is formed by plating or the like on a glass substrate, a semiconductor substrate having an insulation layer formed on the surface, or the like.

The conductive portion provided on each of the bases 20, 30 functions, by applying an alternating current to the portion in a solution, as an anode or a cathode depending on the direction of the current flow.

FIG. 2A shows an example in which a pair of the bases 20, 30 having the same configuration is immersed in a solution; however, the number of bases is not limited thereto. Two or more pairs of the bases can be used. Further, an electrode which is made of a conductive member and functions only as a counter electrode at the time of electrolysis such as a gold electrode or a platinum electrode may be used instead of one of the bases.

Further, an alternating current may be applied between the conductive portions of the bases 20, 30 while stirring the solution S by using a magnetic stirrer or a stirring blade.

At this time, in the anode, it is considered that a chemical reaction represented by the following chemical reaction formulas (1) to (3) occurs.

$$Zn(OH)_4^{2-} \rightarrow Zn(OH)_2 + 2OH^- \tag{1}$$

$$2OH^- \rightarrow \tfrac{1}{2}O_2 + H_2O + 2e^- \tag{2}$$

$$Zn(OH)_2 \rightarrow ZnO + H_2O \tag{3}$$

On the other hand, in the cathode, for example, it is considered that a chemical reaction represented by the following chemical reaction formulas (4) to (6) occurs.

$$NO_3^- + H_2O + 2e^- \rightarrow NO_2^- + 2OH^- \tag{4}$$

$$Zn^{2+} + 2OH^- \rightarrow Zn(OH)_2 \tag{5}$$

$$Zn(OH)_2 \rightarrow ZnO + H_2O \tag{6}$$

In such a way, by applying an alternating current between the bases 20, 30 immersed in the solution S, the anode reaction (chemical reaction represented by the above chemical reaction formulas (1) to (3)) and the cathode reaction (chemical reaction represented by the above chemical reaction formulas (4) to (6)) alternately occur on the conductive portion of the surface in each of the base 20 and the base 30, and a zinc oxide thin film is formed on a region including the conductive portion.

According to the method of manufacturing a zinc oxide thin film of the present embodiment, when the conductive portion on the base is a pair of conductive portions arranged to face to each other across an insulation gap, by applying an alternating current only to one of the conductive portions of the pair and performing alternating-current electrolysis, a zinc oxide thin film is formed such that the zinc oxide thin film bridges the gap between the one of the conductive portions and the other of the conductive portions. At this time, it is not necessary to particularly control the electric potential of the other of the conductive portions, and the other of the conductive portions may be in a floating electric potential.

That is, a zinc oxide thin film grows such that the zinc oxide thin film fills an insulation gap and connects a conductive portion to which the alternating current is applied and a conductive portion which is in a floating electric potential and faces, across the insulation gap, the conductive portion to which the alternating current is applied. The mechanism of such a phenomenon arising is not clear; however, it is estimated that the alternately occurring anode and cathode reactions by the alternating current may be some reason.

The inventors of the present invention have found such a phenomenon as a result of long-period experiments and research. Based on this finding, a novel semiconductor manufacturing process is provided capable of forming a zinc oxide thin film even on a region including an insulation portion by electrolytic deposition.

According to the formation of a zinc oxide thin film using an alternating current (hereinafter, may be referred to as "alternating-current electrolysis") of the present embodiment, it is possible to form a zinc oxide thin film having high purity and sufficiently large mobility such that the zinc oxide thin film bridges the gap between a pair of electrodes formed on a substrate at a distance between the electrodes.

Accordingly, by forming a source electrode and a drain electrode on a substrate in advance and applying an alternating current to at least one of the electrodes to perform alternating-current electrolysis, it is possible to form a zinc oxide semiconductor layer between the source electrode and the drain electrode. Further, by providing a gate electrode by appropriate means, it is possible to manufacture a thin film transistor.

On the other hand, by the known direct-current electrolysis, a zinc oxide thin film is formed only directly on an electrode on the cathode side. That is, since it is impossible to form a zinc oxide thin film between electrodes, a thin film transistor structure cannot be obtained.

The temperature of the solution S can be 150° C. or less and is preferably 20 to 80° C.

When the temperature of the solution S is more than 150° C., particulate zinc oxide crystals are precipitated from tetrahydroxozincate (II) ions and may come to be mixed in the solution S. Further, since the pH of the solution S is decreased along with the progress of the chemical reaction which precipitates zinc oxide particles, it may be difficult to preserve the solution S.

Note that, in order to adjust the temperature of the solution S, for example, a method in which the container 10 containing the solution S is placed on a heater such as a hotplate, a method in which the container 10 containing the solution S is immersed in a silicon oil heater, or the like is used.

The current density in the deposition surface of a current (electrolysis current) applied between the bases 20, 30 immersed in the solution S can be 0.1 to 3 mA/cm$^2$ and is preferably 0.5 to 1.5 mA/cm$^2$. The current density of an alternating current is the peak value.

When the current density in the surface of the conductive portion (electrode) on which zinc oxide is deposited is less than 0.1 mA/cm$^2$, a desired electrochemical reaction may not occur, and it may be impossible to form a zinc oxide thin film.

On the other hand, when the current density is more than 3 mA/cm$^2$, the deposition of zinc becomes dominant, and the deposition of a zinc oxide thin film is less likely to occur. It is considered that this is because, when the current density is large, the reaction at the cathode progresses too fast, and the deposition of a zinc thin film found in common zinc plating represented by $Zn^{2+} + 2e^- \rightarrow Zn$ becomes dominant, and the deposition of a zinc oxide thin film is prevented.

Note that, in order to adjust the current density to be in the above range, the voltage applied between electrodes and the distance between electrodes may be adjusted.

The frequency of an alternating current applied between electrodes can be 0.1 to 10 Hz and is preferably 0.3 to 3 Hz.

When the frequency of an alternating current applied between electrodes is less than 0.1 Hz, since the switching between the anode and the cathode is too slow, zinc deposition occurring at the cathode may become dominant and cannot be followed by the oxidation reaction, and a zinc oxide thin film may not be formed. On the other hand, when the frequency of an alternating current applied between electrodes is more than 10 Hz, since the switching between the anode and the cathode is too fast, a sufficient time to the start of the reaction cannot be obtained, the desired chemical reaction may not occur, and it may be impossible to form a zinc oxide thin film.

In the present embodiment, as shown in FIG. 2B, any one of or both of the bases 20, 30 may be a base 50 configured by: a substrate 51; an insulation film 52 provided on a surface 51*a* of the substrate 51; a source electrode 60 provided on a surface 52*a* of the insulation film 52; and a drain electrode 70 provided on the surface 52*a*. The source electrode 60 is arranged to be away from the drain electrode 70 at a predetermined distance d and is electrically isolated from the drain electrode 70.

The source electrode and the drain electrode refer to electrodes, the electrodes being configured such that a semiconductor layer to be a channel layer is formed between the electrodes and that a gate electrode is appropriately provided and thereby being capable of functioning as a source electrode and a drain electrode of a thin film transistor.

Further, the base 50 is fixed (held) by a conductive clip 80 so as to clip the drain electrode 70 and the substrate 51 in the thickness direction of the base 50. The conductive clip 80 is configured by a metal having superior corrosion durability such as stainless steel.

FIG. 2C is a diagram showing the base 50 shown in FIG. 2B as viewed from the surface on which the source electrode 60 and the drain electrode 70 are formed. In the present embodiment, each of the source electrode 60 and the drain electrode 70 has a convex planar shape as viewed from the surface side. That is, the source electrode 60 has a convex section 60a having a rectangular shape. The drain electrode 70 has a convex section 70a having a rectangular shape. The source electrode 60 and the drain electrode 70 are arranged such that the convex section 60a of the source electrode 60 and the convex section 70a of the drain electrode 70 face each other.

In a thin film transistor structure of this electrode arrangement, the source electrode width is defined by a width W of the convex section 60a of the source electrode 60. Similarly, the drain electrode width is defined by a width W of the convex section 70a of the drain electrode 70. That is, in the thin film transistor of the structure shown in FIG. 2C, each of the electrode width of the source electrode and the electrode width of the drain electrode is W.

As shown in FIG. 2C, the position of the base 50 is adjusted such that an end of the convex section 70a of the drain electrode 70 is positioned at a depth D from a liquid surface Sa. In the present embodiment, part of the convex section 70a of the drain electrode 70 is immersed in the solution S.

The thickness of the substrate 51 and the thickness of the insulation film 52 are not particularly limited and are appropriately adjusted in accordance with the required specifications or the like.

The material of the substrate 51 is not particularly limited; and, for example, a glass substrate, a resin film, a silicon substrate, or the like can be used as the substrate 51.

The material of the insulation layer 52 is not particularly limited; and a film made of silicon dioxide ($SiO_2$), a film made of aluminum oxide ($Al_2O_3$), or the like can be used. When the substrate 51 is made of an insulator, the source electrode 60 and/or the drain electrode 70 may be formed directly on the substrate 51 without providing the insulation film 52 on the substrate 51.

The source electrode 60 may be configured by a first layer 61 made of chromium (Cr) and a second layer 62 made of gold (Au), the layers being layered in this order on the insulation film 52. The thickness of the first layer 61 and the thickness of the second layer 62 are not particularly limited and are appropriately adjusted in accordance with the required specifications or the like.

The drain electrode 70 may be configured by a first layer 71 made of chromium (Cr) and a second layer 72 made of gold (Au), the layers being layered in this order on the insulation film 52. The thickness of the first layer 71 and the thickness of the second layer 72 are not particularly limited and are appropriately adjusted in accordance with the required specifications or the like.

The distance d between the source electrode 60 and the drain electrode 70 is not particularly limited and is appropriately adjusted in accordance with the required specifications or the like. For example, the distance d is 1 μm to 1000 μm. Note that, the insulation layer 52 is exposed in a gap 63 between the source electrode 60 and the drain electrode 70, and the gap 63 is a non-conductive portion (isolation gap).

When such bases 20, 30 are used, the liquid surface Sa of the solution S is arranged to be above the gap 63 between the source electrode 60 and the drain electrode 70.

When an alternating current is applied to the drain electrode 70 of the base 50 immersed in the solution S, a zinc oxide thin film (coat) is formed on a region including a portion of the drain electrode 70, the portion being in contact with the solution S. More specifically, in addition to on the drain electrode 70, a zinc oxide thin film is also formed on the isolation film 52 which opens in the gap 63 between the source electrode 60 and the drain electrode 70, and the zinc oxide thin film is grown such that the zinc oxide thin film bridges the gap between the source electrode 60 and the drain electrode 70. Further, a zinc oxide thin film is also formed on the source electrode 60 which is not connected to the AC power source.

In the above embodiment, the source electrode 60 is completely immersed in the solution S, part of the drain electrode 70 is made to come into contact with the solution S, and the electrolytic deposition is performed; however, an arrangement may be used in which the source electrode 60 and the drain electrode 70 are replaced with each other. Further, the source electrode 60 and the drain electrode 70 may both be immersed completely in the solution S.

Next, the obtained zinc oxide thin film is rinsed using pure water adjusted to a predetermined temperature, and impurities contained in the zinc oxide thin film is removed (step S3).

The temperature of the pure water is not particularly limited and is, for example, about 70° C.

Next, by completely drying the zinc oxide thin film, the zinc oxide thin film can be obtained (step S4).

Note that, according to the method of manufacturing a zinc oxide thin film of the present embodiment, by the electrolytic deposition method, a zinc oxide thin film is formed not only in the space between the source electrode 60 and the drain electrode 70 but also on the source electrode 60 and on the drain electrode 70.

Here, the term "on the source electrode 60" refers to "on a (top) surface of the source electrode 60 on the opposite side of another (bottom) surface of the source electrode 60, the another surface being in contact with the insulation film 52, and on a lateral surface of the source electrode 60". The term "on the drain electrode 70" refers to "on a (top) surface of the drain electrode 70 on the opposite side of another (bottom) surface of the drain electrode 70, the another surface being in contact with the insulation film 52, and on a lateral surface of the drain electrode 70".

According to the method of manufacturing a zinc oxide thin film of the present embodiment, by a non-vacuum and low-temperature wet deposition method, it is possible to manufacture a zinc oxide thin film having high purity and sufficiently large mobility.

Further, according to the method of manufacturing a zinc oxide thin film of the present embodiment, it is possible to form a zinc oxide thin film such that the zinc oxide thin film bridges the gap between a source electrode and a drain electrode using an electrolytic deposition method. That is, according to the method of manufacturing a zinc oxide thin film of the present embodiment, it is possible to form a zinc oxide thin film simply and selectively between metal electrodes.

Further, according to the method of manufacturing a zinc oxide thin film of the present embodiment, it is possible to form a zinc oxide thin film not only between the source electrode and the drain electrode by the electrolytic deposition method but also on a non-conductive gate insulation film. The zinc oxide thin film formed in this way and bridging the gap between the source electrode and the drain electrode functions as a channel layer of a thin film transistor (TFT).

[Zinc Oxide Thin Film]

A zinc oxide thin film of the present embodiment is manufactured by the method of manufacturing a zinc oxide thin film of the above-described embodiment.

The zinc oxide thin film of the present embodiment has high purity and sufficiently large mobility. Further, when the zinc oxide thin film of the present embodiment is formed such that the zinc oxide thin film bridges the gap between a source electrode and a drain electrode, the zinc oxide thin film can function as a channel layer of a thin film transistor (TFT).

[Thin Film Transistor]

A thin film transistor of the present embodiment is a transistor in which a channel layer, a gate insulation layer, a protection insulation layer, an electrode layer, and the like are formed on a silicon substrate or a substrate made of a resin film, a variety of glass such as quartz glass, or the like. The thin film transistor of the present embodiment has a channel layer or a gate insulation layer made of the zinc oxide thin film manufactured by the method of manufacturing a zinc oxide thin film of the above-described embodiment.

The type of the thin film transistor of the present embodiment is not particularly limited and may be any of a staggered-type transistor, an inverted staggered-type transistor, a coplanar-type transistor, and an inverted coplanar-type transistor.

Specifically, the thin film transistor having the channel layer made of the zinc oxide thin film manufactured by the method of manufacturing a zinc oxide thin film of the above-described embodiment has sufficiently large mobility.

[Transparent Oxide Wiring]

A transparent oxide wiring of the present embodiment is made of the zinc oxide thin film manufactured by the method of manufacturing a zinc oxide thin film of the above-described embodiment.

The transparent oxide wiring of the present embodiment is formed on an insulating substrate made of a variety of glass such as quartz glass, a resin film, or the like by the method of manufacturing a zinc oxide thin film of the above-described embodiment. The insulating substrate also includes a substrate in which an insulation layer is formed on a conductive substrate made from metal or the like.

Note that, the shape of the transparent oxide wiring is not particularly limited. It is possible to form the transparent oxide wiring in an arbitrary shape by adjusting the shape or the spacing of electrodes or by performing masking if necessary.

The transparent oxide wiring made of the zinc oxide thin film manufactured by the method of manufacturing a zinc oxide thin film of the above-described embodiment has a high purity and a low amount of impurities and therefore has low resistance and superior electrical conductivity.

EXAMPLES

Hereinafter, Examples and Comparative Examples of the present invention will be further specifically described; however, the present invention is not limited to the following Examples.

The physical property measurement method in Examples and Comparative Examples is as follows.

(Surface Shape)

The surface shape of the obtained zinc oxide thin film was observed by using a Scanning Electron Microscope (SEM).

(Film Composition)

The film composition was obtained by using Energy Dispersive X-ray Spectrometry (EDX).

(TFT Characteristic)

By changing a gate voltage, in between two electrodes (source-drain), the current-voltage measurement of a zinc oxide thin film formed between the two electrodes was performed. A digital electrometer (ADCMT8252) having a voltage generating function of ±200 V was connected to the source electrode and the drain electrode of a device, and the current ($I_{SD}$) between the source electrode and the drain electrode was measured.

At the same time, a voltage current source (ADVANTEST R6161) was connected to the gate electrode and the source electrode portion, and thereby a desired gate voltage was applied between the source electrode and the drain electrode.

Each measurement apparatus was connected via a GPIB connection to a personal computer, and setting of a variety of parameters and capturing of data were performed by a program created using LabVIEW.

Note that, in the following Examples and Comparative Examples, the n-Si substrate was used as the gate electrode to measure TFT characteristics.

Example 1

10 mL of 13-mol/L aqueous ammonia was added to 0.01 mol of zinc nitrate hexahydrate to prepare a mixed aqueous solution of zinc nitrate hexahydrate and ammonia. At this time, the temperature was 20° C., and the pH was about 11.

In addition, an electrode for thin film deposition was prepared.

As a substrate, an n-Si wafer in which an insulation film made of silicon dioxide ($SiO_2$) having a thickness of 150 nm was formed all over by a thermal process was used.

A base for thin film deposition was fabricated by forming a source electrode having a rectangle shape and a drain electrode having a rectangle shape on the insulation film at a distance such that one side of the rectangle of the source electrode faced one side of the rectangle of the drain electrode, each of the electrodes being formed by laminating a layer made of chromium having a thickness of 5 nm and a layer made of gold having a thickness of 100 nm using a sputtering method. Note that, the distance between the source electrode and the drain electrode was 50 μm, and the shape of the source electrode was made to be completely symmetric with the shape of the drain electrode.

Next, a pair of the above bases was immersed at a predetermined distance in a mixed aqueous solution contained in a container at a temperature of 20° C. At this time, the pair of the bases was immersed in the mixed aqueous solution such that the liquid surface of the mixed aqueous solution was positioned above the gap between the source electrode and the drain electrode and that the drain electrode was above the source electrode as shown in FIG. 2B. The height of the base was adjusted such that the contact area between the drain electrode and the mixed aqueous solution was 1 $cm^2$.

In this state, a sine-wave AC voltage (peak value) of ±5 V was applied between the drain electrodes of the pair of the bases. At this time, the spacing (distance) between the drain electrodes was adjusted such that the current density in the surface of the drain electrode in contact with the mixed aqueous solution was 1 mA/cm². At this time, the distance between the drain electrodes was about 1 cm. Further, the frequency of the alternating current applied between the drain electrodes of the pair of the bases was 1 Hz.

When a deposition time was 60 minutes, the deposition time being a duration that the AC voltage had been applied between the drain electrodes of the bases, it was possible to form a thin film having a thickness of 50 nm. The thin film was formed on a space between the source electrode and the drain electrode, on the source electrode, and on the drain electrode.

Next, by rinsing the obtained thin film using pure water at a temperature of about 70° C., impurities contained in the thin film were removed.

Next, the thin film was completely dried.

Figure 3:
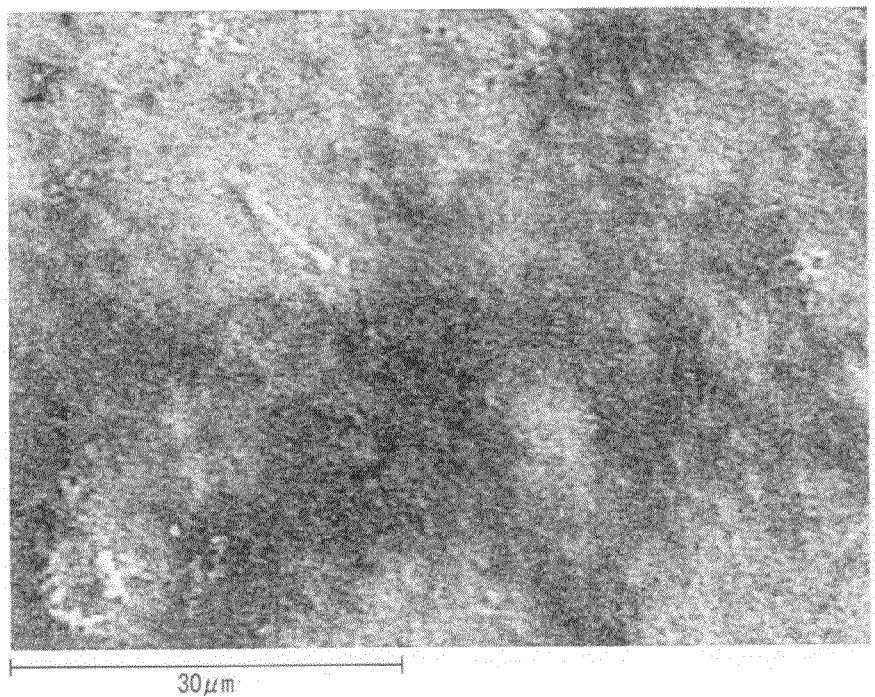
FIG. 3 is a SEM image of a thin film fabricated in Example 1.

The obtained thin film was observed by using a Scanning Electron Microscope (SEM). FIG. 3 is a 2000-fold SEM image of the fabricated thin film. As shown in FIG. 3, it was found that the obtained thin film was uniform.

Figure 4:
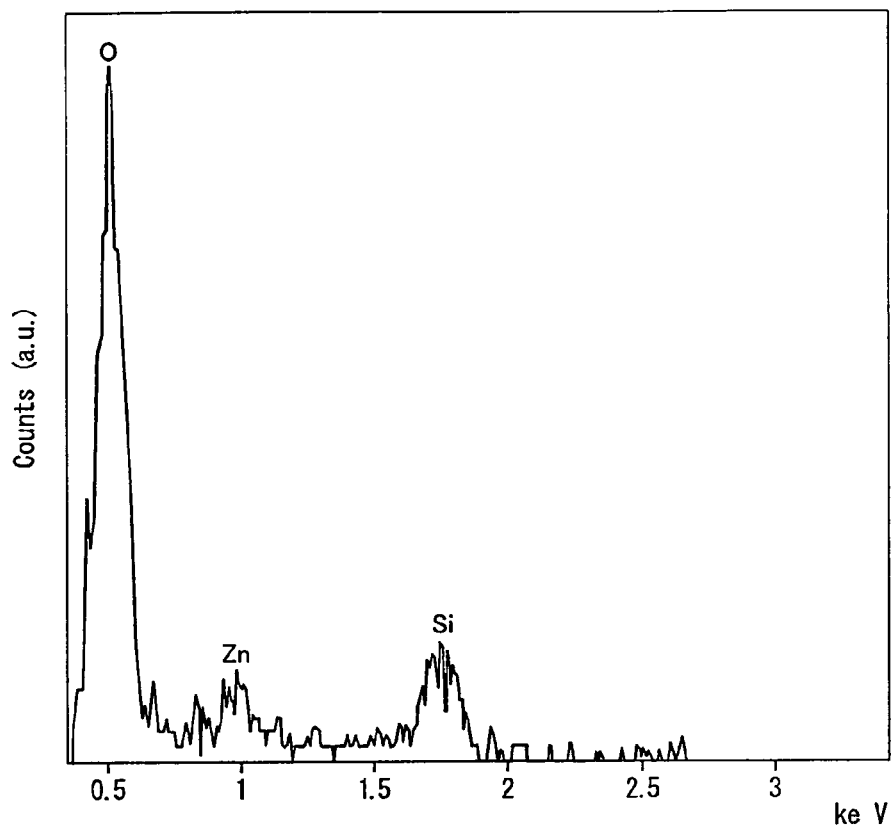
FIG. 4 is a diagram showing a measurement result of a composition analysis by EDX of the thin film fabricated in Example 1.

Further, a point on the thin film formed between the source electrode and the drain electrode was analyzed by a point composition analysis using EDX. As a result, as shown in FIG. 4, only oxygen (O) and zinc (Zn) were detected as the element other than silicon (Si) as the substrate material. Further, a diffraction peak of ZnO was detected by X-ray diffraction (XRD), and it was found that a zinc oxide thin film was formed. Accordingly, it was possible to form a zinc oxide thin film by electrolytic deposition on an insulator ($SiO_2$ film) interposed between a pair of metal electrodes.

Figure 5:
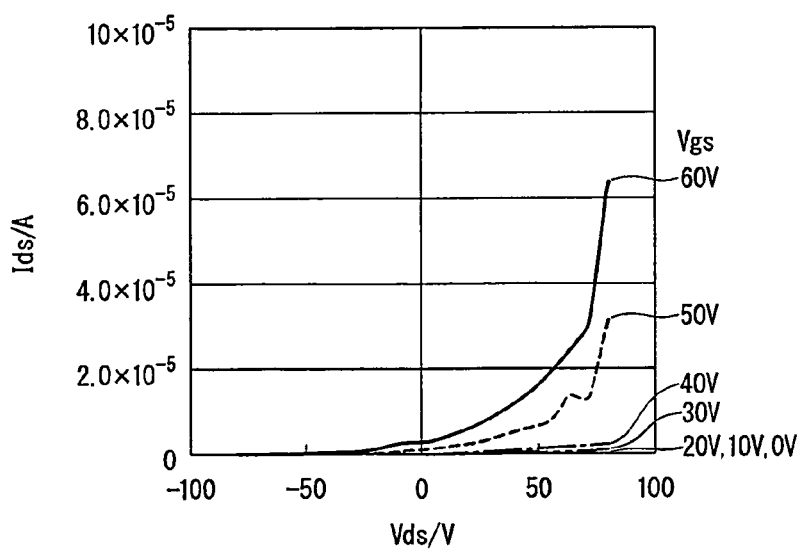
FIG. 5 is a graph showing a measurement result of a TFT characteristic of the thin film fabricated in Example 1.

Further, in FIG. 5, a measurement result of a TFT characteristic of the zinc oxide thin film formed between the source electrode and the drain electrode is shown.

From the result of FIG. 5, it was found that when the gate voltage was 0 V, the obtained drain current was about 1/10000 of the drain current of 3 µA when the gate voltage was 40 V. The estimated mobility was 0.13 $cm^2/V \cdot s$, and the on/off ratio was $10^4$. That is, it was found that the zinc oxide thin film functioned as a channel layer of a thin film transistor.

Further, the mobility is a very high value as a mobility of a zinc oxide thin film fabricated by a wet process at room-temperature.

Note that, the on/off ratio represents a ratio of the maximum value to the minimum value of the drain current when the gate voltage is modulated.

Example 2

A thin film having a thickness of 50 nm was formed between the source electrode and the drain electrode in the same manner as Example 1 except for setting the frequency of the alternating current applied between the drain electrodes to 2.5 Hz.

The TFT characteristic of the obtained thin film was measured. The result is shown in Table 1.

From the result of Table 1, it was possible to confirm an operation in which the on/off ratio was about $10^2$.

Example 3

A thin film having a thickness of 50 nm was formed between the source electrode and the drain electrode in the same manner as Example 1 except for setting the frequency of the alternating current applied between the drain electrodes to 0.5 Hz.

The TFT characteristic of the obtained thin film was measured. The result is shown in Table 1.

From the result of Table 1, it was possible to confirm an operation in which the on/off ratio was about $10^2$.

Comparative Example 1

In the same manner as Example 1 except for applying a DC voltage of 5 V between the drain electrodes, an attempt was made to form a thin film between the electrodes.

However, a thin film was not formed between the source electrode and the drain electrode.

Comparative Example 2

A thin film having a thickness of 50 nm was formed between the source electrode and the drain electrode in the same manner as Example 1 except for setting the frequency of the alternating current applied between the drain electrodes to 5 Hz.

The TFT characteristic of the obtained thin film was measured. The result is shown in Table 1.

From the result of Table 1, it was impossible to confirm an operation as a TFT.

Comparative Example 3

A thin film having a thickness of 50 nm was formed between the source electrode and the drain electrode in the same manner as Example 1 except for setting the current density of the alternating current applied between the drain electrodes to 5 mA/cm² and setting the frequency of the alternating current to 1 Hz.

The TFT characteristic of the obtained thin film was measured. The result is shown in Table 1.

From the result of Table 1, it was impossible to confirm an operation as a TFT. Formation of a silver-colored thin film which derives from zinc deposition on the electrode was observed, and it is considered that oxidation did not follow the zinc deposition.

TABLE 1

| | | EXAMPLE 1 | EXAMPLE 2 | EXAMPLE 3 | COMPARATIVE EXAMPLE 1 | COMPARATIVE EXAMPLE 2 | COMPARATIVE EXAMPLE 3 |
|---|---|---|---|---|---|---|---|
| DEPOSITION CONDITION | FREQUENCY [Hz] | 1 | 2.5 | 0.5 | — | 5 | 1 |
| | VOLTAGE [V] | ±5 | ±5 | ±5 | 5 | ±5 | ±5 |
| EVALUATION | FILM THICKNESS [nm] | 50 | 50 | 50 | 0 | 50 | 50 |
| | ON/OFF RATIO | $10^4$ | $10^2$ | $10^2$ | — | — | — |

Example 4

The pH of the mixed aqueous solution was 11 in Example 1; however, in the present example, the pH of the mixed aqueous solution was changed to perform electrolytic deposition. The conditions of the mixed aqueous solution other than the pH were the same as those of Example 1. In the present example, by adjusting the dropping amount of aqueous ammonia having a concentration of 10 mol/L, the pH of the mixed aqueous solution was adjusted to 8.8, 9.0, 9.3, or 9.5. Further, in the present example, the spacing of the source electrode and the drain electrode was set to 35 μm.

Figure 6:
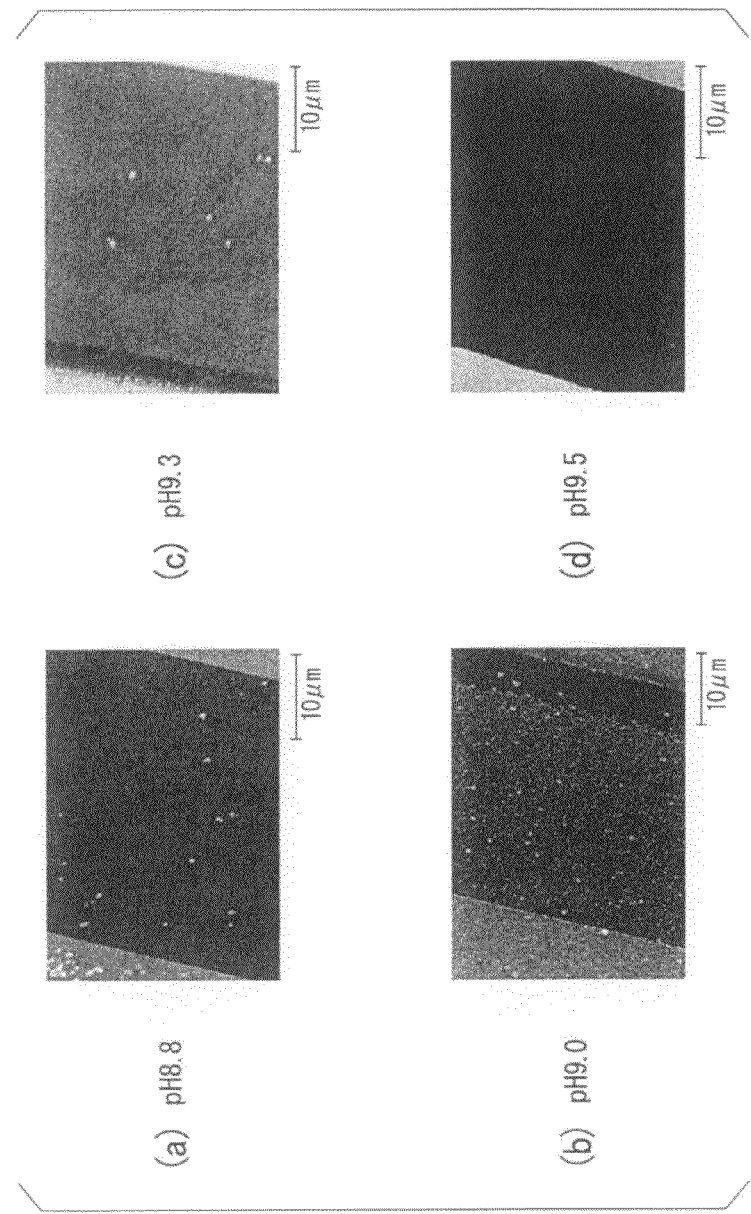
FIG. 6 is a SEM image of a thin film fabricated in Example 4.

FIG. 6 is a SEM image of a thin film formed between the source electrode and the drain electrode for each pH. One of the triangular regions seen at each of both ends in the SEM image is each of part of the source electrode and part of the drain electrode. As shown in FIG. 6 (a) and FIG. 6 (b), deposition of fine particles was confirmed for a pH of 8.8 and for a pH of 9.0. On the other hand, as shown in FIG. 6 (c) and FIG. 6 (d), growth of a thin film was confirmed for a pH of 9.3 and for a pH of 9.5. That is, it was found that the formation mode of the thin film was shifted from deposition of fine particles to growth of a thin film in accordance with an increase in pH.

Figures 7, 8:
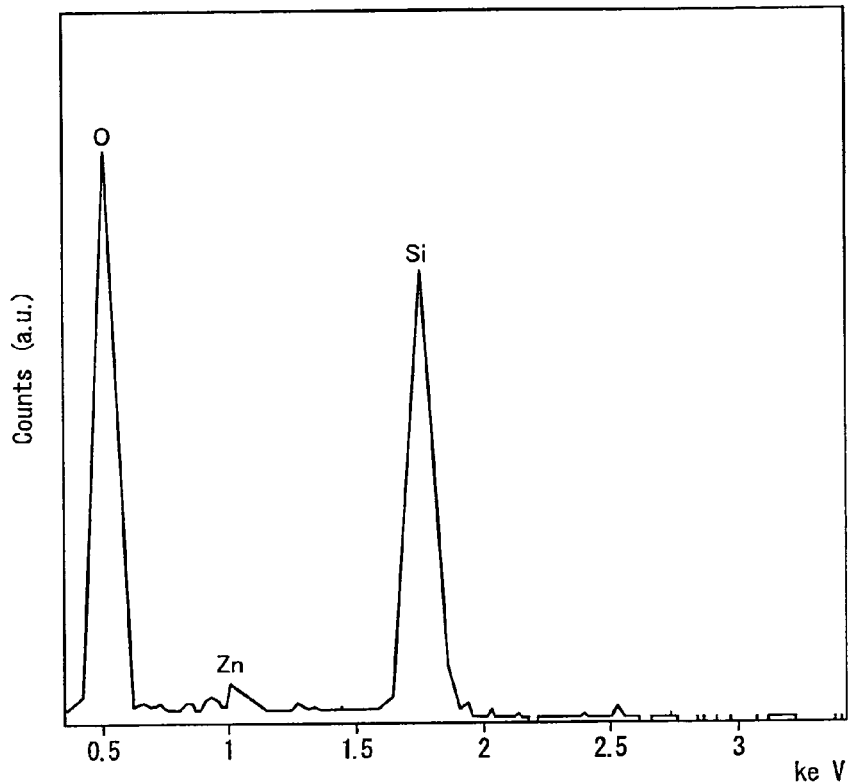
FIG. 7 is a diagram showing a measurement result of a composition analysis by EDX of the thin film fabricated in Example 4.
FIG. 8 is a graph showing a measurement result of a variety of characteristics of the thin film fabricated in Example 4.

For a pH of 9.5, a point on the thin film formed between the source electrode and the drain electrode was analyzed by a point composition analysis using EDX. As a result, as shown in FIG. 7, only oxygen (O) and zinc (Zn) were detected as the element other than silicon (Si) as the substrate material. Further, a diffraction peak of zinc oxide (ZnO) was detected by XRD. From the results of EDX and XRD, it was found that a thin film of zinc oxide was formed.

In FIG. 8, regarding the above four different types of pH, the state of obtained zinc oxide, film thickness, and electrical properties are shown. For the case of a pH of 9.5, the highest mobility and the largest on/off ratio were obtained.

Example 5

In the above Examples and Comparative Examples, a Si wafer was used as the substrate. In Example 5, a PET (Polyethylene Terephthalate) substrate (manufactured by Toyobo Co., Ltd.) was used as the substrate, and fabrication of a thin film transistor on the PET substrate was performed.

Figure 9:
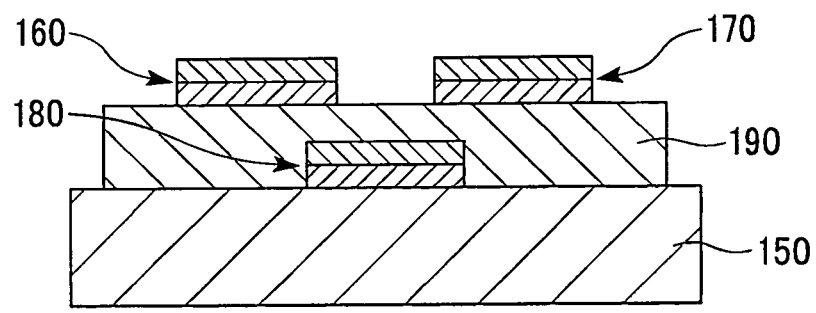
FIG. 9 is a wiring structure for a TFT on a PET substrate fabricated in Example 5.

FIG. 9 is a wiring structure for a TFT on a PET substrate and shows a device structure before deposition of zinc oxide. The device structure of FIG. 9 was fabricated by the following process.

First, a gate electrode 180 made of NiP/Au having a thickness of 50 nm was fabricated on a PET substrate 150 using electroless plating.

Next, a gate insulation layer 190 having a film thickness of 1 μm and made of Polyvinyl Phenol (PVP) and epoxy resin was formed. Commercially available PVP and epoxy resin were used, and a coating solution for forming a gate insulation film 190 was obtained by adding a photopolymerization initiator and a solvent to the PVP and epoxy resin.

A spin coat film was formed by spin coating (1000 rpm, 30 sec) using the coating solution and was prebaked at a temperature of 105° C. for 30 minutes. Then, UV (Ultraviolet) exposure was performed for 30 seconds, and subsequently annealing was performed at a temperature of 120° C. for 30 minutes to form the gate insulation film 190 made of PVP.

Next, a source electrode 160 and a drain electrode 170 each having a film thickness of 50 nm and made of NiP/Au was fabricated using electroless plating.

By performing the above process, a device structure shown in FIG. 9 was obtained.

Electrolytic deposition of a zinc oxide thin film was performed for the above device structure in order to form a channel layer of a TFT. The pH of the mixed aqueous solution was set to 9.5 which is capable of obtaining a TFT exhibiting the highest performance in Example 4. The conditions other than the pH of the mixed aqueous solution were made to be the same as those of Example 1.

Figure 10:
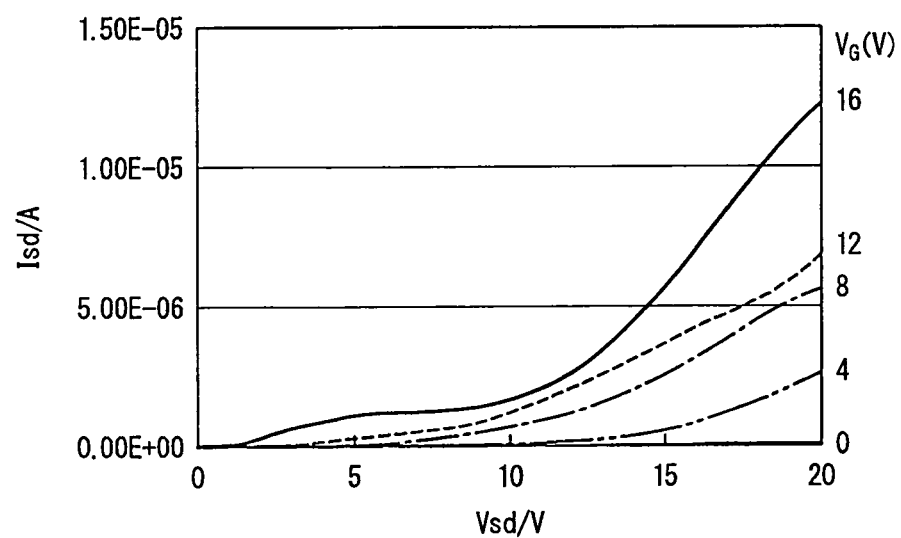
FIG. 10 is a graph showing a measurement result of a current-voltage characteristic of the TFT on a PET substrate fabricated in Example 5.

FIG. 10 is a current-voltage characteristic of the obtained TFT on the PET substrate. Similarly to the case of the TFT on the n-Si wafer of Example 4, operation characteristics as a transistor were obtained. The mobility of the TFT device was 0.3 cm$^2$/V·s, and the on/off ratio was 10$^3$.

What is claimed is:

1. A method of manufacturing a zinc oxide thin film, the method comprising:
    immersing, in a solution containing zinc ions, hydroxide ions, and zinc complex ions, a base having at least a pair of conductive portions arranged to face to each other across an insulation gap, one of the conductive portions being in at least part of the base; and
    by applying an alternating current to the one of the conductive portions, forming a first zinc oxide thin film on a region of the base, the region including the one of the conductive portions, and forming a second zinc oxide thin film such that the second zinc oxide thin film bridges a gap between the conductive portions of the pair.

2. The method of manufacturing a zinc oxide thin film according to claim 1, wherein
    the pH of the solution is 8 to 12.

3. The method of manufacturing a zinc oxide thin film according to claim 1, wherein
    the temperature of the solution is 150° C. or less.

4. The method of manufacturing a zinc oxide thin film according to claim 1, wherein
    the frequency of the alternating current is 0.1 to 10 Hz.

5. A method of manufacturing a thin film transistor, the method comprising:
    performing the method according to claim 1,
    wherein the conductive portions are, respectively, a source electrode and a drain electrode formed on a substrate, such that the second zinc oxide thin film bridges a gap between a source electrode and a drain electrode formed on a substrate.

6. A thin film transistor comprising:
    a channel layer formed by the second zinc oxide thin film manufactured by the method of manufacturing a thin film transistor according to claim 5.

7. A thin film transistor comprising:
    a gate insulation layer formed by the second zinc oxide thin film manufactured by the method of manufacturing a thin film transistor according to claim 5.

8. A zinc oxide thin film manufactured by the method of manufacturing a zinc oxide thin film according to claim 1.

9. A transparent oxide wiring made of the zinc oxide thin film manufactured by the method of manufacturing a zinc oxide thin film according to claim 1.

10. A method of manufacturing a thin film transistor, the method comprising:
    forming a zinc oxide thin film such that the zinc oxide thin film bridges a gap between a source electrode and a drain electrode formed on a substrate, by a method including immersing a base having a conductive portion in at least part of the base, in a solution containing zinc ions, hydroxide ions, and zinc complex ions, the conductive portion being the source electrode or the drain electrode, and by applying an alternating current to the conductive portion, forming a first zinc oxide thin film on a region of the base, the region including the conductive portion, and forming a second zinc oxide thin film such that the second zinc oxide thin film bridges the gap.

11. A thin film transistor comprising:

a channel layer formed by the second zinc oxide thin film manufactured by the method of manufacturing a thin film transistor according to claim 10.

12. A thin film transistor comprising:

a gate insulation layer formed by the second zinc oxide thin film manufactured by the method of manufacturing a thin film transistor according to claim 10.

* * * * *